United States Patent
Deguchi et al.

(10) Patent No.: US 8,707,893 B2
(45) Date of Patent: Apr. 29, 2014

(54) SUBSTRATE TREATMENT SYSTEM, SUBSTRATE TREATMENT METHOD, AND NON-TRANSITORY COMPUTER STORAGE MEDIUM

(75) Inventors: Masatoshi Deguchi, Kumamoto (JP); Hideo Funakoshi, Koshi (JP); Toshichika Takei, Koshi (JP); Norifumi Sato, Koshi (JP); Wataru Kiyota, Koshi (JP); Daisuke Ishimaru, Koshi (JP); Shinichi Machidori, Koshi (JP); Ikuo Sunaka, Koshi (JP); Shigenori Kamei, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 160 days.

(21) Appl. No.: 13/300,114

(22) Filed: Nov. 18, 2011

(65) Prior Publication Data

US 2012/0135148 A1 May 31, 2012

(30) Foreign Application Priority Data

Nov. 29, 2010 (JP) .................................. 2010-265257

(51) Int. Cl.
| | |
|---|---|
| B05C 13/00 | (2006.01) |
| B05C 13/02 | (2006.01) |
| B05C 21/00 | (2006.01) |
| B65H 1/00 | (2006.01) |

(52) U.S. Cl.
USPC ........... 118/503; 118/500; 118/300; 118/663; 414/222.01; 414/225.01; 414/806

(58) Field of Classification Search
CPC .................. H01L 21/68707; H01L 21/67748; H01L 21/67259; B25J 15/0616; B25J 15/0014; B05C 5/00; B05C 9/02
USPC .................. 118/695, 696, 500, 503; 414/941, 414/222–226
See application file for complete search history.

(56) References Cited

U.S. PATENT DOCUMENTS

| | | | | |
|---|---|---|---|---|
| 4,566,726 A | * | 1/1986 | Correnti et al. | 414/941 |
| 5,125,791 A | * | 6/1992 | Volovich | 198/394 |
| 5,700,046 A | * | 12/1997 | Van Doren et al. | 414/941 |
| 2007/0186850 A1 | * | 8/2007 | Matsuoka et al. | 118/719 |

FOREIGN PATENT DOCUMENTS

| | | |
|---|---|---|
| JP | A-H8-46010 | 2/1996 |
| JP | 08-222618 A | 8/1996 |
| JP | 2003-224173 A | 8/2003 |
| JP | A-2010-258170 | 11/2010 |

* cited by examiner

*Primary Examiner* — Dah-Wei D Yuan
*Assistant Examiner* — Binu Thomas
(74) *Attorney, Agent, or Firm* — Posz Law Group, PLC

(57) ABSTRACT

A substrate treatment system includes a plurality of treatment apparatuses, a position adjustment apparatus adjusting a center position of the substrate, a substrate transfer apparatus transferring the substrate to the treatment apparatuses and the position adjustment apparatus, and a control unit controlling operations of the apparatuses. The substrate transfer apparatus includes an arm part curved along a peripheral edge portion of the substrate with a radius of curvature larger than a radius of the substrate, and a holding part projecting inward from the arm part and holding a rear surface of the substrate. The position adjustment apparatus includes a mounting table which holds a central portion of the rear surface of the substrate and is rotatable and horizontally movable. The control unit controls the mounting table such that the center position of the substrate held on the mounting table is aligned with a center position of the arm part.

18 Claims, 14 Drawing Sheets

US 8,707,893 B2

SUBSTRATE TREATMENT SYSTEM, SUBSTRATE TREATMENT METHOD, AND NON-TRANSITORY COMPUTER STORAGE MEDIUM

BACKGROUND OF THE INVENTION

1. Field of the Invention

The present invention relates to a substrate treatment system, a substrate treatment method, and a non-transitory computer storage medium.

2. Description of the Related Art

For example, in manufacturing processes of a semiconductor device, for example, a photolithography processing is performed on a semiconductor wafer (hereinafter, referred to as a "wafer") to form a predetermined pattern such as via holes in a polyimide film on the wafer. More specifically, coating treatment for forming the polyimide film by applying a polyimide solution onto the wafer, exposure processing for exposing a predetermined pattern on the polyimide film, developing treatment for developing the exposed polyimide film and so on are sequentially performed, whereby the predetermined pattern is formed in the polyimide film on the wafer.

A series of photolithography processing is generally performed using a coating and developing treatment system including treatment apparatuses treating the wafer and a transfer apparatus transferring the wafer (Japanese Laid-open Patent Publication No. H8-46010).

Incidentally, when performing treatment on the water, the wafer needs to be accurately disposed at a predetermined position in the treatment apparatus. The alignment of the wafer is performed by tweezers (hereinafter, referred to as a "transfer arm") performing transfer to each of the treatment apparatuses while holding the wafer. In this case, a guide is provided at a substrate holding part of the transfer arm to slide the wafer to the substrate holding part when receiving the wafer to thereby perform alignment (Japanese Laid-open Patent Publication No. 2010-258170).

SUMMARY OF THE INVENTION

However, since the polyimide solution has a high viscosity, the dry state of the polyimide film is not sufficient yet at the time when the polyimide solution is applied in the coating treatment apparatus performing the above-described coating treatment and the wafer is then transferred out of the coating treatment apparatus. Therefore, during the transfer of the wafer by the transfer arm, the peripheral edge portion of the wafer can come into contact with the transfer arm to result in adhesion of the polyimide film to the transfer arm. If the polyimide film adheres to the transfer arm in this manner, the adhered matter scatters in the system or is transcribed to another wafer, causing occurrence of particle contamination.

Hence, the inventors tried to transfer the wafer with the peripheral edge portion of the wafer being not in contact with the transfer arm. However, in this case, the guide of the transfer arm does not function to fail to perform positioning of the wafer. Further, for example, when the center position of the transfer arm is displaced from the center position of the wafer before transfer into the treatment apparatus, the wafer is not accurately disposed at a predetermined position in the treatment apparatus. Therefore, it is impossible to appropriately treat the wafer in the treatment apparatus.

The present invention has been made in view of the above points, and an object thereof is to appropriately treat a substrate while suppressing adherence of a coating film to a transfer arm.

To achieve the above object, the present invention is a substrate treatment system including a plurality of treatment apparatuses treating a substrate, a position adjustment apparatus adjusting a center position of the substrate, a substrate transfer apparatus transferring the substrate to the treatment apparatuses and the position adjustment apparatus, and a control unit controlling operations of the apparatuses, the substrate transfer apparatus including an arm part curved along a peripheral edge portion of the substrate with a radius of curvature larger than a radius of the substrate and a holding part projecting inward from the arm part and holding a rear surface of the substrate, the position adjustment apparatus including a mounting table which holds a central portion of the rear surface of the substrate and is rotatable and horizontally movable, wherein the control unit controls the mounting table to rotate and horizontally move such that the center position of the substrate held on the mounting table is aligned with a center position of the arm part.

According to the present invention, the center position of the substrate held on the mounting table is adjusted to align with the center position of the arm part in the position adjustment apparatus. This ensures that when the substrate is thereafter transferred out of the position adjustment apparatus by the substrate transfer apparatus, the substrate can be delivered from the mounting table to an appropriate position on the arm part. In other words, the center position of the arm part is aligned with the center position of the substrate, so that the substrate never comes into contact with the arm part. Thereafter, the substrate is transferred by the substrate transfer apparatus to a treatment apparatus, and the substrate is subjected to treatment in the treatment apparatus. In this event, since the substrate is held at the appropriate position on the arm part, the substrate is accurately disposed at a predetermined position in the treatment apparatus. Therefore, the substrate can be appropriately treated in the treatment apparatus. Thereafter, also when the substrate is transferred out of the treatment apparatus by the substrate transfer apparatus, the substrate is held at the appropriate position on the arm part as described above. Therefore, the substrate never comes into contact with the arm part in the substrate transfer apparatus. Accordingly, the coating film on the substrate never adheres to the arm part, thus never causing particle contamination unlike the prior art. According to the present invention, it is possible to appropriately treat the substrate while suppressing adherence of the coating film to the transfer arm as described above.

The position adjustment apparatus may include a position detection unit detecting the center position of the substrate held on the mounting table and a moving mechanism moving the mounting table, and the moving mechanism may turn the mounting table around a vertical axis and move the mounting table in one direction being a horizontal direction based on a detection result of the center position of the substrate by the position detection unit.

The holding part may hold the substrate by a friction force between the holding part and the substrate. Further, the holding part may have a suction port formed at a tip portion thereof and connected to a vacuum pump, and the holding part may hold the substrate by suction from the suction port.

The plurality of treatment apparatuses may include a coating treatment apparatus applying a coating solution onto the substrate whose center position has been adjusted in the position adjustment apparatus.

The coating solution may be a polyimide solution. Note that the polyimide solution is a solution made by dissolving a polyimide precursor, for example, polyamide acid in a solvent.

The substrate treatment system may further include a treatment block in which the treatment apparatuses including the coating treatment apparatus are stacked in multiple tiers in a vertical direction; another treatment block in which the position adjustment apparatus and another treatment apparatus are stacked in multiple tiers in the vertical direction; and another substrate transfer apparatus transferring the substrate to the position adjustment apparatus and the another treatment apparatus in the another treatment block, wherein the another substrate transfer apparatus may include another arm part curved along the peripheral edge portion of the substrate with a radius of curvature larger than the radius of the substrate and another holding part projecting inward from the another arm part and holding the rear surface of the substrate. In this case, the another holding part may hold the substrate by a friction force between the another holding part and the substrate. Further, the another holding part may have a suction port formed at a tip portion thereof and connected to a vacuum pump, and the another holding part may hold the substrate by suction from the suction port.

The plurality of treatment apparatuses may include a temperature regulation apparatus regulating a temperature of the substrate, a thermal treatment apparatus performing thermal treatment on the substrate on which the coating solution has been applied in the coating treatment apparatus, to form a coating film on the substrate, and an edge portion cleaning apparatus cleaning and removing the coating film on the peripheral edge portion of the substrate formed in the thermal treatment apparatus, wherein the substrate transfer apparatus may transfer the substrate to the temperature regulation apparatus, the thermal treatment apparatus, and the edge portion cleaning apparatus.

The present invention according to another aspect is a substrate treatment method using a substrate treatment system, the substrate treatment system including a plurality of treatment apparatuses treating a substrate, a position adjustment apparatus adjusting a center position of the substrate, and a substrate transfer apparatus transferring the substrate to the treatment apparatuses and the position adjustment apparatus, the substrate transfer apparatus including an arm part curved along a peripheral edge portion of the substrate with a radius of curvature larger than a radius of the substrate and a holding part projecting inward from the arm part and holding a rear surface of the substrate, the position adjustment apparatus including a mounting table which holds a central portion of the rear surface of the substrate and is rotatable and horizontally movable, the substrate treatment method including: a position adjustment step of rotating and horizontally moving the mounting table such that the center position of the substrate held on the mounting table is aligned with a center position of the arm part in the position adjustment apparatus; and a transfer step of then transferring the substrate out of the position adjustment apparatus using the substrate transfer apparatus with the peripheral edge portion of the substrate not in contact with the arm part.

The position adjustment apparatus may include a position detection unit detecting the center position of the substrate held on the mounting table and a moving mechanism moving the mounting table, and the position adjustment step may include the steps of detecting the center position of the substrate by the position detection unit; and turning the mounting table around a vertical axis and moving the mounting table in one direction being a horizontal direction by the moving mechanism based on a result of the position detection.

The plurality of treatment apparatuses may include a coating treatment apparatus including another mounting table holding and rotating the central portion of the rear surface of the substrate and a coating solution nozzle supplying the coating solution onto the substrate held on the another mounting table, and after the transfer step, the substrate may be delivered between the arm part and the another mounting table such that the center position of the substrate held by the arm part is aligned with a center position of the another mounting table.

The coating solution may be a polyimide solution.

The holding part may hold the substrate by a friction force between the holding part and the substrate. Further, the holding part may have a suction port formed at a tip portion thereof and connected to a vacuum pump, and the holding part may hold the substrate by suction from the suction port.

The plurality of treatment apparatuses may include a temperature regulation apparatus regulating a temperature of the substrate, a thermal treatment apparatus performing thermal treatment on the substrate on which the coating solution has been applied in the coating treatment apparatus, to form a coating film on the substrate, and an edge portion cleaning apparatus cleaning and removing the coating film on the peripheral edge portion of the substrate formed in the thermal treatment apparatus, wherein the substrate treatment method may include a first temperature regulation step of regulating a temperature of the substrate to a predetermined temperature in the temperature regulation apparatus, before the position adjustment step; a thermal treatment step of performing thermal treatment on the substrate after applying the coating solution onto the substrate in the coating treatment apparatus, to form the coating film on the substrate in the thermal treatment apparatus; a second temperature regulation step of regulating the temperature of the substrate to a predetermined temperature in the temperature regulation apparatus, after the thermal treatment step; another position adjustment step of adjusting the center position of the substrate in the position adjustment apparatus, after the second temperature regulation step; and a peripheral edge portion cleaning step of cleaning and removing the coating film on the peripheral edge portion of the substrate in the peripheral edge portion cleaning apparatus, after the another position adjustment step, wherein transfer of the substrate to the temperature regulation apparatus, the thermal treatment apparatuses, and the peripheral edge portion cleaning apparatus may be performed using the substrate transfer apparatus with the peripheral edge portion of the substrate not in contact with the arm part. Note that the predetermined temperatures in the first temperature regulation step and the second temperature regulation step are, for example, room temperature.

The present invention according to still another aspect is a non-transitory computer-readable storage medium storing a program running on a computer of a control unit controlling a substrate treatment system to cause the substrate treatment system to execute a substrate treatment method, the substrate treatment system including a plurality of treatment apparatuses treating a substrate, a position adjustment apparatus adjusting a center position of the substrate, and a substrate transfer apparatus transferring the substrate to the treatment apparatuses and the position adjustment apparatus, the substrate transfer apparatus including an arm part curved along a peripheral edge portion of the substrate with a radius of curvature larger than a radius of the substrate and a holding part projecting inward from the arm part and holding a rear surface of the substrate, the position adjustment apparatus including a mounting table which holds a central portion of the rear surface of the substrate and is rotatable and horizontally movable, and the substrate treatment method including a position adjustment step of rotating and horizontally moving the mounting table such that the center position of the substrate held on the mounting table is aligned with a center position of the arm part in the position adjustment apparatus; and a transfer step of then transferring the substrate out of the position adjustment apparatus using the substrate transfer apparatus with the peripheral edge portion of the substrate not in contact with the arm part.

According to the present invention, it is possible to appropriately treat a substrate while suppressing adherence of a coating film to a transfer arm.

DETAILED DESCRIPTION OF THE INVENTION

Figure 1:
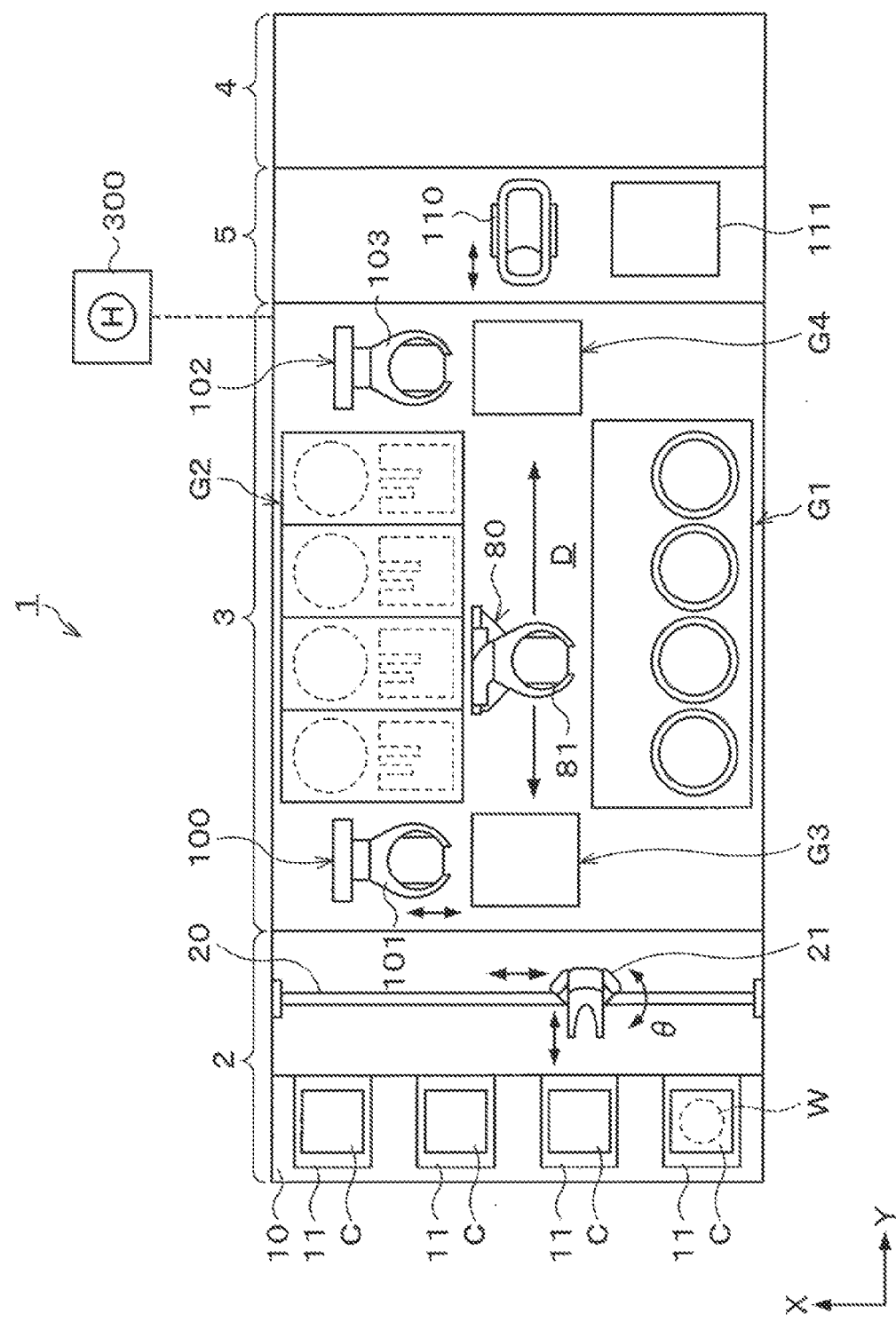
FIG. 1 is a plan view illustrating the outline of the internal configuration of a coating and developing treatment system according to this embodiment.
Figure 2:
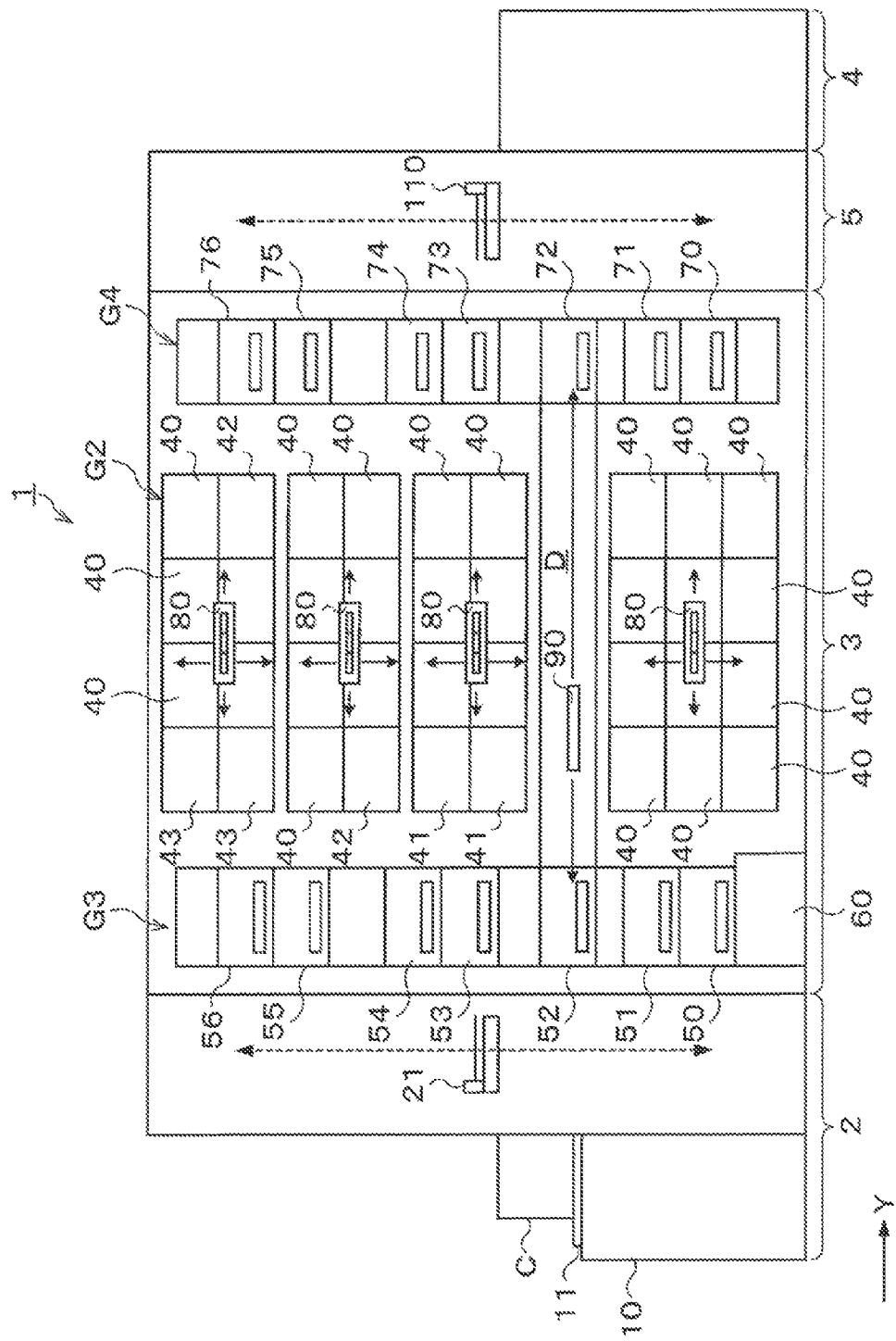
FIG. 2 is a side view illustrating the outline of the internal configuration of the coating and developing treatment system.
Figure 3:
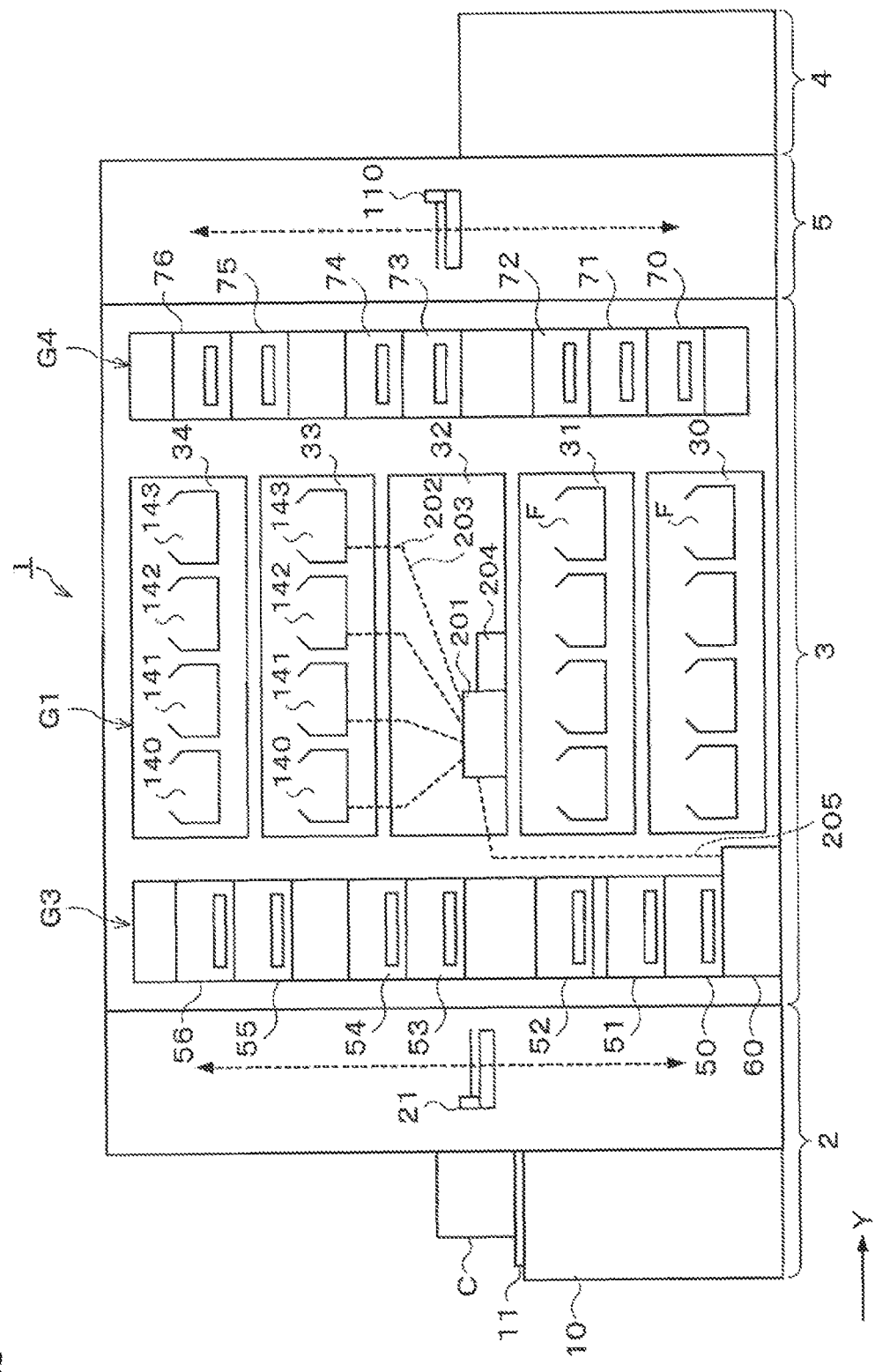
FIG. 3 is a side view illustrating the outline of the internal configuration of the coating and developing treatment system.

Hereinafter, an embodiment of the present invention will be described. FIG. 1 is a plan view illustrating the outline of the internal configuration of a coating and developing treatment system 1 as a substrate treatment system. FIG. 2 and FIG. 3 are side views illustrating the outline of the internal configuration of the coating and developing treatment system 1.

The coating and developing treatment system 1 has, as illustrated in FIG. 1, a configuration in which, for example, a cassette station 2 to/from which a cassette C housing a plurality of wafers W therein is transferred from/to the outside, a treatment station 3 including a plurality of various kinds of treatment apparatuses performing predetermined treatments in a manner of single wafer processing in the photolithography processing, and an interface station 5 for delivering the wafer W to/from an aligner 4 adjacent to the treatment station 3, are integrally connected together.

In the cassette station 2, a cassette mounting table 10 is provided. On the cassette mounting table 10, a plurality of, for example, four cassette mounting plates 11 are provided. The cassette mounting plates 11 are provided side by side in a line in an X-direction (a top and bottom direction in FIG. 1) being the horizontal direction. On the cassette mounting plates 11, cassettes C can be mounted when the cassettes C are transferred from/to the outside of the coating and developing treatment system 1.

In the cassette station 2, a wafer transfer apparatus 21 is provided which is movable on a transfer path 20 extending in the X-direction as illustrated in FIG. 1. The wafer transfer apparatus 21 is movable also in the vertical direction and around a vertical axis (in a θ-direction), and can transfer the wafer W between the cassette C on each of the cassette mounting plates 11 and a later-described predetermined apparatus in a third treatment block G3 in the treatment station 3.

In the treatment station 3, a plurality of, for example, four treatment blocks G1, G2, G3, G4 are provided each including various apparatuses. On the front side (an X-direction negative direction side in FIG. 1) in the treatment station 3, the first treatment block G1 is provided, and on the rear side (an X-direction positive direction side in FIG. 1) in the treatment station 3, the second treatment block G2 is provided. Further, on the cassette station 2 side (a Y-direction negative direction side in FIG. 1) in the treatment station 3, the third treatment block G3 as another treatment block is provided, and on the interface station 5 side (a Y-direction positive direction side in FIG. 1) in the treatment station 3, the fourth treatment block G4 as another treatment block is provided.

For example, in the first treatment block G1, as illustrated in FIG. 3, a plurality of solution treatment apparatuses are stacked in the vertical direction. For example, developing treatment apparatuses 30, 31 each performing developing treatment on the wafer W, a waste liquid recovery apparatus 32 recovering waste liquid drained from a later-described coating treatment apparatus 33, the coating treatment apparatus 33 applying a polyimide solution as a coating solution onto the wafer W to form a polyimide film as a coating film, and a peripheral edge portion cleaning apparatus 34 cleaning and removing the polyimide film on the peripheral edge portion of the wafer W are five-tiered in order from the bottom.

Note that the polyimide solution is a solution made by dissolving a polyimide precursor, for example, polyamide acid in a solvent.

Each of the developing treatment apparatuses 30, 31 has a plurality of, for example, four cups F each housing the wafer W therein during treatment, in the horizontal direction and can treat a plurality of wafers W in parallel. Note that detailed configurations of the waste liquid recovery apparatus 32, the coating treatment apparatus 33, and the peripheral edge portion cleaning apparatus 34 will be described later.

For example, in the second treatment block G2, as illustrated in FIG. 2, thermal treatment apparatuses 40 each performing thermal treatment on the wafer W, adhesion apparatuses 41 each performing hydrophobic treatment on the wafer W, position adjustment apparatuses 42 each adjusting the center position of the wafer W, and edge exposure apparatuses 43 each exposing the outer peripheral portion of the wafer W are arranged one on top of the other and side by side in the vertical direction and the horizontal direction. Note that the numbers and the arrangement of the thermal treatment apparatuses 40, adhesion apparatuses 41, position adjustment apparatuses 42, and edge exposure apparatuses 43 can be arbitrarily selected. In this embodiment, for example, the second treatment block G2 is provided to be separated in four layers in the vertical direction. In the second treatment block G2, for example, the thermal treatment apparatuses 40 are arranged in the layer at a position corresponding to the developing treatment apparatuses 30, 31 in the first treatment block G1. For example, in the layer at a position corresponding to the waste liquid recovery apparatus 32 in the first treatment block G1, the thermal treatment apparatuses 40 and the adhesion apparatuses 41 are arranged. For example, in the layer at a position corresponding to the coating treatment apparatus 33 in the first treatment block G1, the thermal treatment apparatuses 40 and the position adjustment apparatus 42 are arranged. For example, in the layer at a position corresponding to the peripheral edge portion cleaning apparatus 34 in the first treatment block G1, the thermal treatment apparatuses 40, the position adjustment apparatus 42, and the edge exposure apparatuses 43 are arranged.

The thermal treatment apparatus 40 has a heating plate for mounting and heating the wafer W thereon and a cooling plate for mounting and cooling the wafer W thereon and therefore can perform both the heating treatment and cooling treatment. The detailed configuration of the position adjustment apparatus 42 will be described later.

For example, in the third treatment block G3, delivery apparatuses 50, 52, 54, 56 each for delivering the wafer W and temperature regulation apparatuses 51, 53, 55 each regulating the temperature of the wafer W are provided as illustrated in FIG. 2 and FIG. 3. The apparatuses 50 to 56 are arranged in this order from the bottom. Further, in the lowest layer of the third treatment block G3, a waste liquid drainage apparatus 60 for temporarily storing the waste liquid recovered in the waste liquid recovery apparatus 32 and the waste liquid drained from the peripheral edge portion cleaning apparatus 34 and draining the waste liquid to the outside of the coating and developing treatment system 1 is disposed. In the waste liquid drainage apparatus 60, a tank (not illustrated) for temporarily storing the waste liquid and a pump (not illustrated) for draining the waste liquid are provided.

Further, in the fourth treatment block G4, delivery apparatuses 70, 72, 74, 76 each for delivering the wafer W and temperature regulation apparatuses 71, 73, 75 each regulating the temperature of the wafer W are provided. The apparatuses 70 to 76 are arranged in this order from the bottom.

A wafer transfer region D is formed in a region surrounded by the first treatment block G1 to the fourth treatment block G4 as illustrated in FIG. 1. In the wafer transfer region D, for example, a wafer transfer apparatus 80 as a substrate transfer apparatus is disposed.

The wafer transfer apparatus 80 has a transfer arm 81 that is movable, for example, in the Y-direction, in the X-direction, around the vertical axis (in the θ-direction), and in the vertical direction. The wafer transfer apparatus 80 can move in the wafer transfer region D and transfer the wafer W to a predetermined apparatus in the first treatment block G1, the second treatment block G2, the third treatment block G3, and the fourth treatment block G4 therearound.

A plurality of, for example, four wafer transfer apparatuses 80 are arranged in the vertical direction as illustrated, for example, in FIG. 2 and can transfer the wafers W to predetermined apparatuses, in the respective treatment blocks G1 to G4, at the similar heights as those of the wafer transfer apparatuses 80. Note that the plurality of wafer transfer apparatuses 80 are provided at the positions corresponding to the four layers made by dividing the second treatment block G2, respectively, in this embodiment.

Further, in the wafer transfer region D, a shuttle transfer apparatus 90 linearly transferring the wafer W between the third treatment block G3 and the fourth treatment block G4 is provided.

The shuttle transfer apparatus 90 is configured to be linearly movable, for example, in the Y-direction. The shuttle transfer apparatus 90 can move in the Y-direction while supporting the wafer W, and transfer the wafer W between the delivery apparatus 52 in the third treatment block G3 and the delivery apparatus 72 in the fourth treatment block G4.

As illustrated in FIG. 1, a wafer transfer apparatus 100 as another substrate transfer apparatus is provided adjacent, on the X-direction positive direction side, to the third treatment block G3. The wafer transfer apparatus 100 has a transfer arm 101 that is movable, for example, in the X-direction, around the vertical axis (in the θ-direction), and in the vertical direction. The wafer transfer apparatus 100 can move in the vertical direction while supporting the wafer W to transfer the wafer W to a predetermined apparatus in the third treatment block G3.

Further, a wafer transfer apparatus 102 as another substrate transfer apparatus is also provided adjacent, on the X-direction positive direction side, to the fourth treatment block G4. The wafer transfer apparatus 102 has a transfer arm 103 that is movable, for example, in the X-direction, around the vertical axis (in the θ-direction), and in the vertical direction. The wafer transfer apparatus 102 can move in the vertical direction while supporting the wafer W to transfer the wafer W to a predetermined apparatus in the fourth treatment block G4. Note that the wafer transfer apparatus 102 can be omitted when a later-described wafer transfer apparatus 110 has a high transfer performance.

In the interface station 5, a wafer transfer apparatus 110 and a delivery apparatus 111 are provided. The wafer transfer apparatus 110 has a transfer arm that is movable, for example, in the Y-direction, around the vertical axis (in the θ-direction), and in the vertical direction. The wafer transfer apparatus 110 can transfer the wafer W while supporting the wafer W, for example, by the transfer arm, between a predetermined apparatus in the fourth treatment block G4, the delivery apparatus 111, and the aligner 4.

Figure 4:
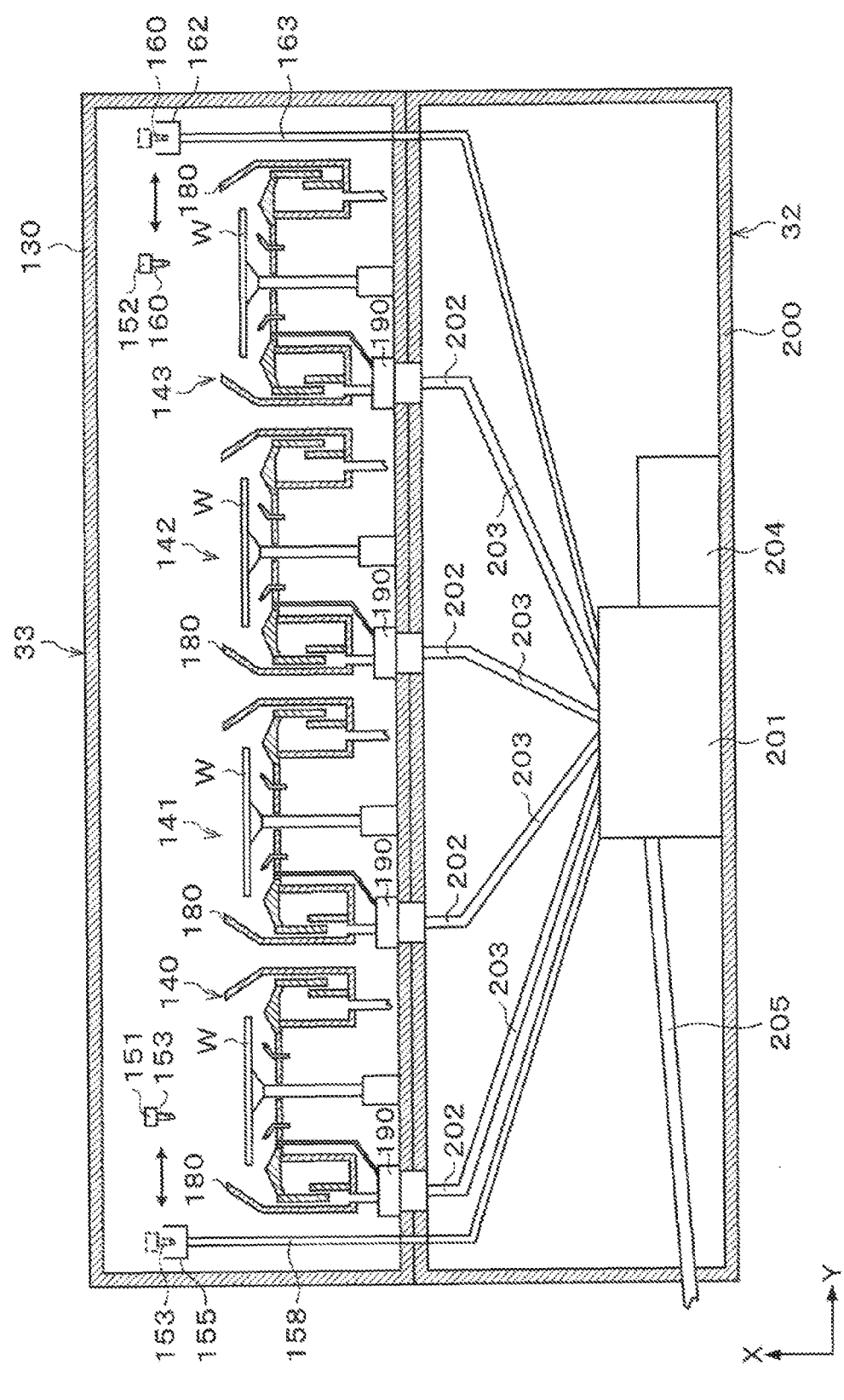
FIG. 4 is a longitudinal sectional view illustrating the outline of the configurations of a coating treatment apparatus and a waste liquid recovery apparatus.
Figure 5:
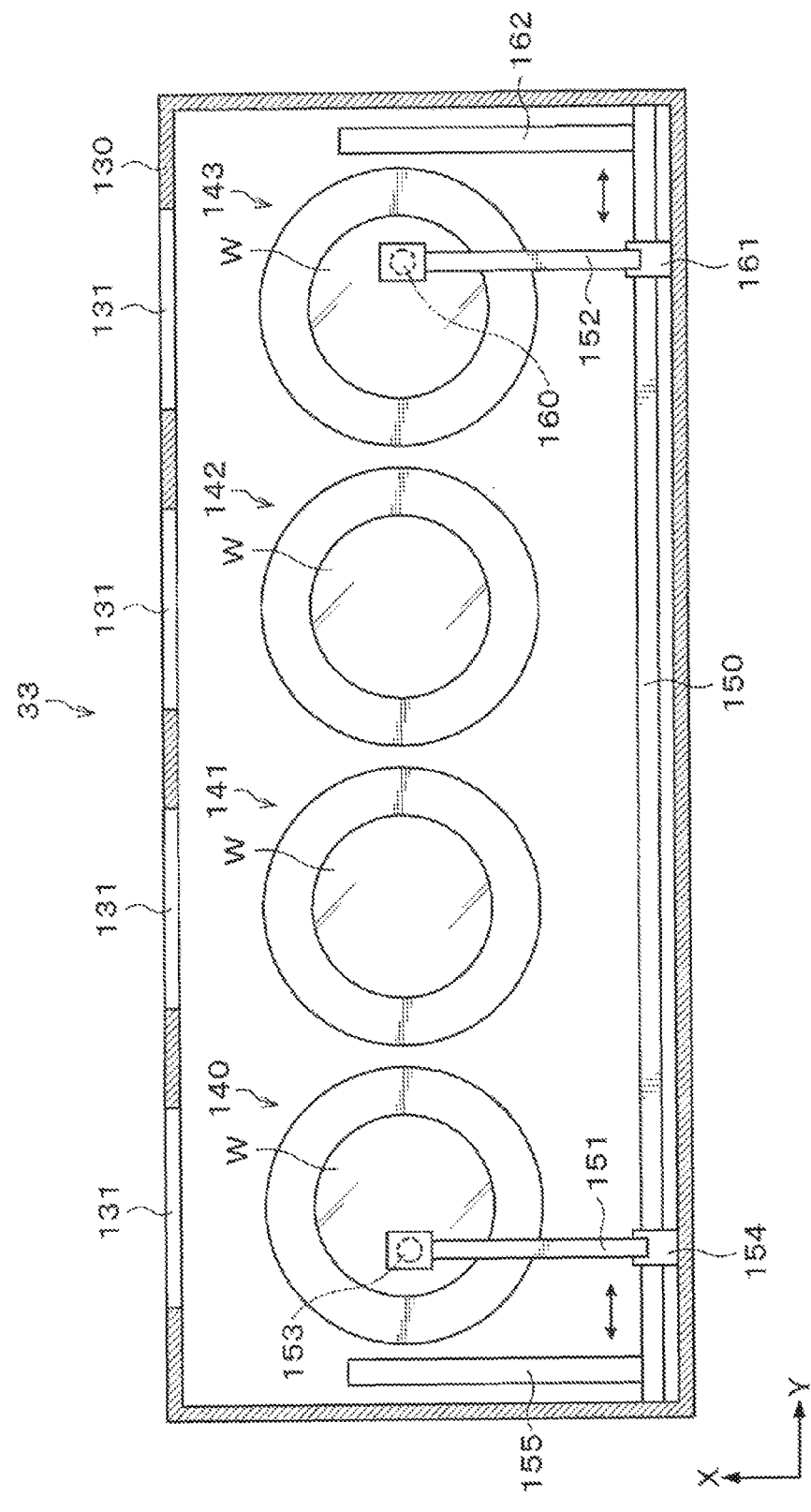
FIG. 5 is a transverse sectional view illustrating the outline of the configuration of the coating treatment apparatus.

Next the configuration of the aforementioned coating treatment apparatus 33 will be described. The coating treatment apparatus 33 has a treatment container 130 capable of hermetically closing the inside thereof as illustrated in FIG. 4 and FIG. 5. In the side surface of the treatment container 130 on the wafer transfer region D side, transfer-in/out ports 131 for the wafers W are formed, for example, at four locations as illustrated in FIG. 5. The transfer-in/out ports 131 are formed at positions corresponding to later-described coating units 140 to 143 respectively.

Inside the treatment container 130, for example, the four coating units 140 to 143 each for applying a polyimide solution onto the wafer W are provided. The coating units 140 to 143 are arranged side by side in this order from the Y-direction negative direction side (the left direction in FIG. 5) to the Y-direction positive direction side (the right direction in FIG. 5).

As illustrated in FIG. 5, a rail 150 extending along the Y-direction (the right and left direction in FIG. 5) is formed on the X-direction negative direction (the lower direction in FIG. 5) side of the coating units 140 to 143. The rail 150 is formed, for example, from a Y-direction negative direction (the left direction in FIG. 5) side outer position of the coating unit 140 to a Y-direction positive direction (the right direction in FIG. 5) side outer position of the coating unit 143. To the rail 150, for example, two arms 151,152 are attached. Here, the arm 151 provided on the X-direction negative direction side is referred to as a first arm 151, and the arm 152 provided on the X-direction positive direction side is referred to as a second arm 152.

Figure 6:
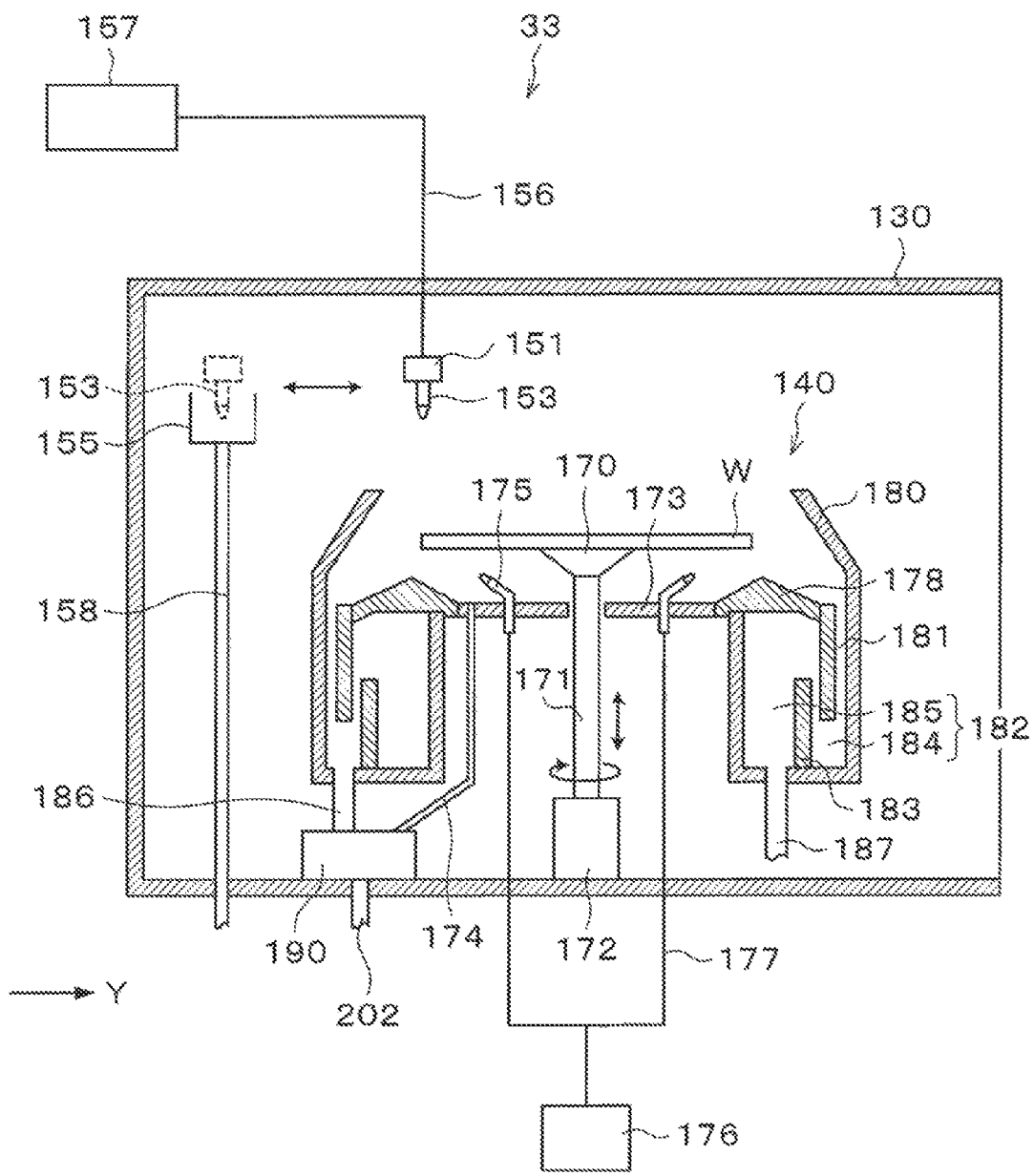
FIG. 6 is a longitudinal sectional view illustrating the outline of the configuration of a coating unit.

On the first arm 151, a first polyimide nozzle 153 as a coating solution nozzle discharging the polyimide solution is supported as illustrated in FIG. 4 and FIG. 5. The first arm 151 is movable on the rail 150 by means of a nozzle drive unit 154 illustrated in FIG. 5. This allows the first polyimide nozzle 153 to move from a waiting section 155 provided at a Y-direction negative direction side outer position of the coating unit 140 to a position above a central portion of the wafer W in each of the coating units 140, 141 and further move in a radial direction of the wafer W above the surface of the wafer W. Further, the first arm 151 can freely move up and down by means of the nozzle drive unit 154 to be able to adjust the height of the first polyimide nozzle 153. To the first polyimide nozzle 153, a polyimide solution supply apparatus 157 supplying the polyimide solution to the first polyimide nozzle 153 is connected via a supply pipe 156 as illustrated in FIG. 6.

Note that the tip portion of the first polyimide nozzle 153 is housed and cleaned during waiting of the first polyimide nozzle 153 at the waiting section 155. The cleaning of the first polyimide nozzle 153 is performed, for example, with a rinse solution for the polyimide solution. The waste liquid generated by the cleaning of the first polyimide nozzle 153 is then drained from a drainage pipe 158 connected to the waiting section 155 and recovered in the waste liquid recovery apparatus 32.

On the second arm 152, a second polyimide nozzle 160 as a coating solution nozzle discharging the polyimide solution is supported as illustrated in FIG. 4 and FIG. 5. The second arm 152 is movable on the rail 150 by means of a nozzle drive unit 161 illustrated in FIG. 5. This allows the second polyimide nozzle 160 to move from a waiting section 162 provided at a Y-direction positive direction side outer position of the coating unit 143 to a position above a central portion of the wafer W in each of the coating units 142, 143 and further move in a radial direction of the wafer W above the surface of the wafer W. Further, the second arm 152 can freely move up and down by means of the nozzle drive unit 161 to be able to adjust the height of the second polyimide nozzle 160. Note that the above-described polyimide solution supply apparatus 157 is connected also to the second polyimide nozzle 160 and supplies the polyimide solution to the second polyimide nozzle 160.

Further, the tip portion of the second polyimide nozzle 160 is housed and cleaned during waiting of the second polyimide nozzle 160 at the waiting section 162. The cleaning of the second polyimide nozzle 160 is performed, for example, with the rinse solution for the polyimide solution. The waste liquid generated by the cleaning of the second polyimide nozzle 160 is then drained from a drainage pipe 163 connected to the waiting section 162 and recovered in the waste liquid recovery apparatus 32.

In the coating unit 140, a spin chuck 170 is provided as another mounting table for rotating the wafer W while holding the central portion of a rear surface of the wafer W as illustrated in FIG. 6. The spin chuck 170 has a horizontal upper surface which is provided with, for example, a suction port (not illustrated) for sucking the wafer W. Suction from the suction port enables the wafer W to be suction-held on the spin chuck 170.

The spin chuck 170 is attached to a shaft 171. Below the spin chuck 170, a rotation drive unit 172 including, for example, a motor, a cylinder and so on is provided via the shaft 171. By means of the rotation drive unit 172, the spin chuck 170 can rotate around the vertical axis at a predetermined speed and move up and down.

On the lower side of the spin chuck 170, a cup base 173 is provided to surround the shaft 171. The cup base 173 can receive and recover liquid dropping to the side of the rear surface of the wafer W held on the spin chuck 170. A drainage pipe 174 for draining the recovered waste liquid is connected to the cup base 173.

Below the spin chuck 170 and above the cup base 173, back rinse nozzles 175, 175 jetting the rinse solution toward the rear surface of the wafer W are provided, for example, at two locations. To the back rinse nozzles 175, a rinse solution supply pipe 177 is connected which communicates with a rinse solution supply source 176. The rinse solution supply source 176 stores the rinse solution for the polyimide solution.

At the outer peripheral portion of the cup base 173, a guide ring 178 is provided which has a cross-section in a mount shape, namely, a shape protruding upward. The outer peripheral portion of the guide ring 178 extends while bending downward.

Beside the spin chuck 170, the wafer W held on the spin chuck 170, and the guide ring 178, a cup 180 is provided in a manner to surround the spin chuck 170, the wafer W, and the guide ring 178. The cup 180 can receive and recover the liquid splashing or dropping from the wafer W.

The cup 180 has an opening portion formed in its upper surface, which is larger than the wafer W so that the spin chuck 170 can move up and down therethrough, and has a gap 181 forming a drainage path between the inner peripheral side surface thereof and an outer peripheral edge of the guide ring 178.

Further, a gas/liquid separation unit 182 exhausting the atmosphere in the cup 180 and recovering the waste liquid in the cup 180 is annularly formed at the lower portion of the cup 180. In the gas/liquid separation unit 182, a bending path is constituted of the outer peripheral portion of the guide ring 178 and a partition wall 183 provided at a bottom surface of the cup 180. The bending path then separates gas and liquid in the gas/liquid separation unit 182. More specifically, the gas/liquid separation unit 182 is partitioned by the partition wall 183 into an outer region 184 for draining the waste liquid in the cup 180 and an inner region 185 for exhausting the atmosphere in the cup 180. To the outer region 184, a drainage pipe 186 draining the waste liquid in the cup 180 is connected.

Further, to the inner region 185, an exhaust pipe 187 exhausting the atmosphere in the cup 180 is connected.

Below the cup 180, a waste liquid container 190 is provided for collecting the waste liquid recovered in the cup base 173 and the cup 180 and draining the waste liquid to the waste liquid recovery apparatus 32. To the upper surface of the waste liquid container 190, the drainage pipe 174 draining the waste liquid recovered in the cup base 173 and the drainage pipe 186 draining the waste liquid recovered in the cup 180 are connected. Further, to the bottom surface of the waste liquid container 190, a later-described vertical pipe 202 of the waste liquid recovery apparatus 32 is connected.

Note that the configurations of the coating units 141, 142, 143 are the same as that of the above-described coating unit 140, and therefore the description thereof is omitted.

Further, the peripheral edge portion cleaning apparatus 34 has a substantially same configuration as the configuration of the above-described coating treatment apparatus 33. The peripheral edge portion cleaning apparatus 34 has an edge rinse nozzle supplying a rinse solution to the peripheral edge portion of the wafer W held on the spin chuck 170 in place of the polyimide nozzles 153, 160 of the coating treatment apparatus 33. The edge rinse nozzle may be individually provided for each of the coating units 140 to 143. Further, the waste liquid recovered in the waste liquid container 190 of each of the coating units 140 to 143 is directly drained to the waste liquid drainage apparatus 160. The other configuration of the peripheral edge portion cleaning apparatus 34 is the same as that of the above-described coating treatment apparatus 33, and therefore the description thereof is omitted.

Next, the configuration of the aforementioned waste liquid recovery apparatus 32 will be described. The waste liquid recovery apparatus 32 has a treatment container 200 as illustrated in FIG. 4.

Inside the treatment container 200, a recovery tank 201 as a waste liquid recovery unit recovering the waste liquid from the coating treatment apparatuses 33 is provided. The recovery tank 201 is connected to the above-described waste liquid containers 190 via the vertical pipes 202 and inclined pipes 203. The vertical pipe 202 is provided extending vertically downward from the waste liquid container 190. The inclined pipe 203 is provided to extend from the end portion of the vertical pipe 202 to the recovery tank 201 inclined at a predetermined angle. The predetermined angle is an angle at which the waste liquid smoothly flows through the inclined pipe 203 without clogging, for example, 15 degrees or more from the horizontal direction. Further, to the recovery tank 201, the drainage pipes 158, 163 draining the waste liquid from the waiting sections 155, 162 of the coating treatment apparatuses 33 are also connected.

Inside the treatment container 200, a pump 204 for draining the waste liquid from the recovery tank 201 is provided. To the recovery tank 201, a drainage pipe 205 is connected, and the drainage pipe 205 communicates with the waste liquid drainage apparatus 60 as illustrated in FIG. 3. The waste liquid is then drained by the pump 204 from the recovery tank 201 to the waste liquid drainage apparatus 60, and the waste liquid is further drained by the pump in the waste liquid drainage apparatus 60 from the waste liquid drainage apparatus 60 to the outside of the coating and developing treatment system 1.

Note that inside the treatment container 200, a cleaning mechanism (not illustrated) cleaning the inside of the recovery tank 201 and a filer (not illustrated) for removing impurities in the waste liquid drained from the recovery tank 201 may be provided.

Figure 7:
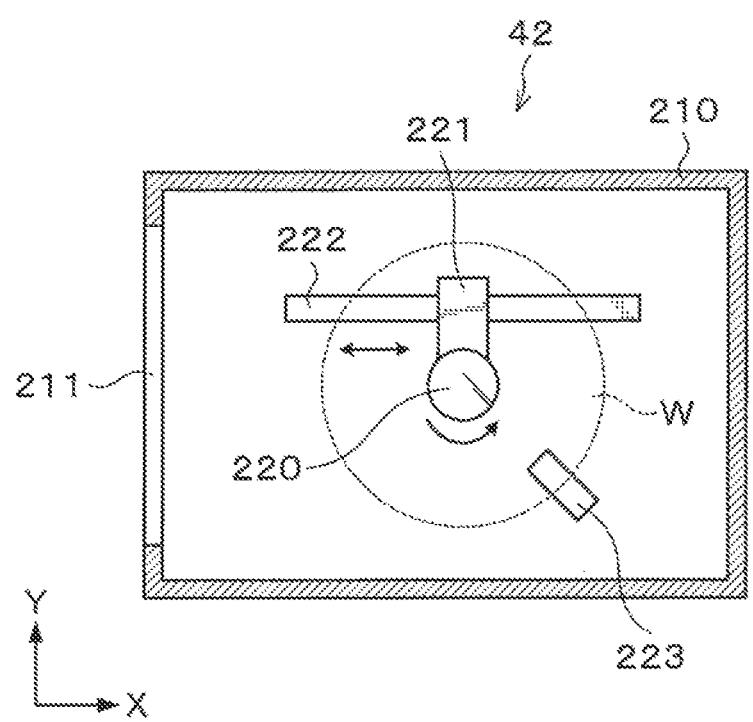
FIG. 7 is a transverse sectional view illustrating the outline of the configuration of a position adjustment apparatus.

Next, the configuration of the aforementioned position adjustment apparatus 42 will be described. The position adjustment apparatus 42 has a treatment container 210 capable of hermetically closing the inside thereof as illustrated in FIG. 7. In the side surface of the treatment container 210 on the wafer transfer region D side, a transfer-in/out ports 211 for the wafer W is formed.

Inside the treatment container 210, a chuck 220 is provided as a mounting table for suction-holding the central portion of the rear surface of the wafer W. In other words, the chuck 220 does not hold the peripheral edge portion of the wafer W. The chuck 220 has a horizontal upper surface which is provided with, for example, a suction port (not illustrated) for sucking the wafer W. Suction from the suction port enables the wafer W to be suction-held on the chuck 220.

The chuck 220 is provided with a chuck drive unit 221. The chuck drive unit 221 is attached to the top of a rail 222 provided on the bottom surface in the treatment container 210 and extending along the X-direction (the right and left direction in FIG. 7). By means of the chuck drive unit 221, the chuck 220 is movable along the rail 222 and turnable around the vertical axis. Note that in this embodiment, the chuck drive unit 221 and the rail 222 constitute a moving mechanism.

Further, inside the treatment container 210, a position detection unit 223 is provided which detects the center position of the wafer W held on the chuck 220. The position detection unit 223 has, for example, a CCD camera capturing an image of the peripheral edge portion of the wafer W and can detect the center position of the wafer W held on the chuck 220, namely, the displacement amount of the central portion of the wafer W from a predetermined position. Then, based on the detection result detected in the position detection unit 223, a later-described control unit 300 controls the drive of the chuck drive unit 221 to move the chuck 220 by a predetermine amount. Concretely, the chuck 220 is moved such that the center position of the wafer W held on the chuck 220 is aligned with the center position of the wafer W to be held by a later-described arm part 230 of the wafer transfer apparatus 80.

Figure 8:
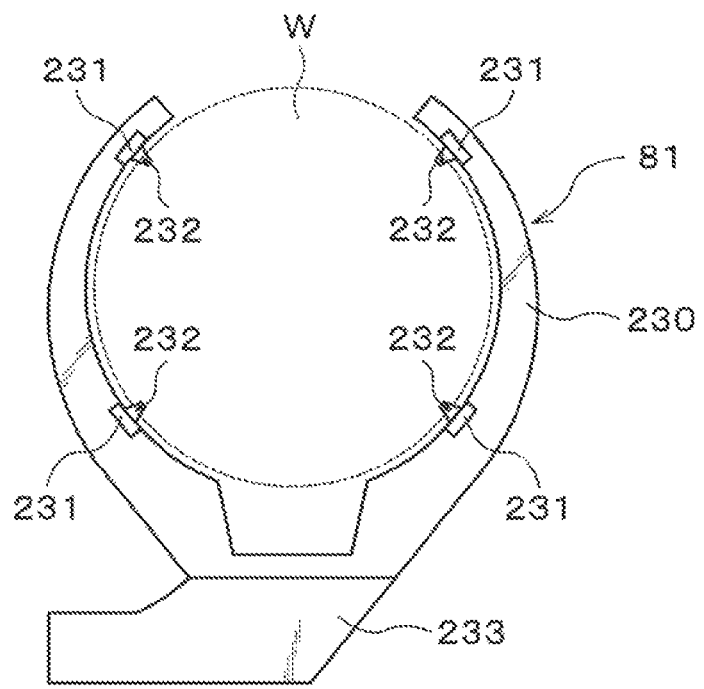
FIG. 8 is a plan view illustrating the outline of the configuration of a transfer arm.
Figure 9:
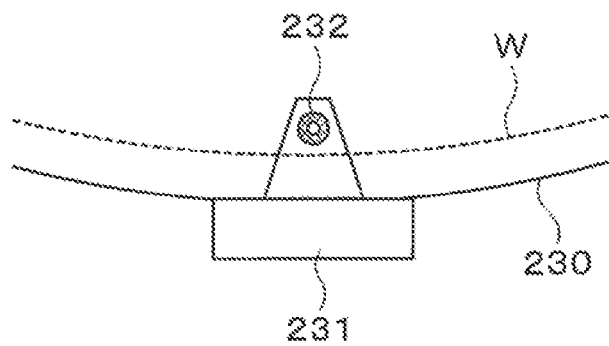
FIG. 9 is a plan view illustrating the outline of the configuration of a holding part of the transfer arm.

Next, the configuration of the transfer arm 81 of the aforementioned wafer transfer apparatus 80 will be described. The transfer arm 81 has the arm part 230 configured in an almost ¾ circular ring shape as illustrated in FIG. 8. The arm part 230 is curved along the peripheral edge portion of the wafer W with a radius of curvature larger than the radius of the wafer W. The arm part 230 is provided with holding parts 231 projecting inward from the arm part 230 and holding the rear surface of the peripheral edge portion of the wafer W at a plurality of, for example, four locations. At the tip portion of the holding part 231, an O-ring 232 made of resin is provided as illustrated in FIG. 9. By the O-rings 232 coming into contact with the rear surface of the peripheral edge portion of the wafer W and with the friction force between the O-rings 232 and the wafer W, the holding parts 231 hold the rear surface of the peripheral edge portion of the wafer W. The transfer arm 81 can thus horizontally hold the wafer W on the holding parts 231. Further, since the radius of curvature of the arm part 230 is larger than the radius of the wafer W, the peripheral edge portion of the wafer W never comes into contact with the arm part 230. Further, the holding parts 231 hold the rear surface of the peripheral edge portion of the wafer W, so that even if particles are generated between the holding parts 231 and the wafer W, the particles hardly get around to the front surface side of the wafer W as compared to the case that the side surface of the wafer is held as in the prior art. Therefore, the front surface of the wafer W can be kept clean.

At the base end portion of the arm part 230, a support part 233 is provided which is integrally formed with the arm part 230 and supports the arm part 230 as illustrated in FIG. 8. The support part 233 is provided with an arm drive unit (not illustrated). By means of the arm drive unit, the transfer arm 81 is movable in the horizontal direction, in the vertical direction, and around the vertical axis (in the θ-direction).

Figure 10:
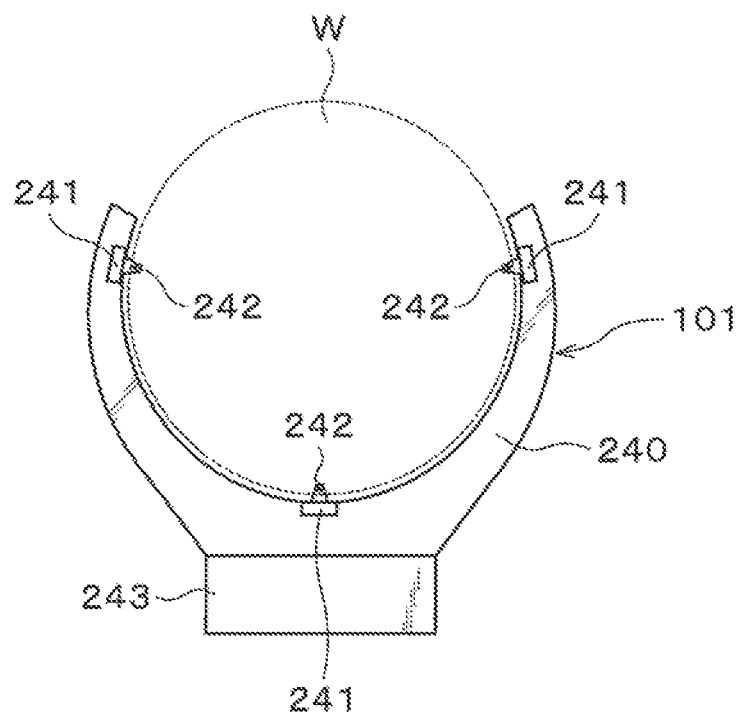
FIG. 10 is a plan view illustrating the outline of the configuration of a transfer arm.

Next, the configurations of the transfer arms 101, 103 of the above-described wafer transfer apparatuses 100, 102 will be described. The transfer arm 101 has an arm part 240 as another arm part configured in an almost C-shape as illustrated in FIG. 10. The arm part 240 is curved along the peripheral edge portion of the wafer W with a radius of curvature larger than the radius of the wafer W. The arm part 240 is provided with holding parts 241 projecting inward from the arm part 240 and holding the rear surface of the peripheral edge portion of the wafer W at a plurality of, for example, three locations. At the tip portion of the holding part 241, an O-ring 242 made of resin similar to the O-ring 232 illustrated in FIG. 9 is provided. By the O-rings 242 coming into contact with the rear surface of the peripheral edge portion of the wafer W and with the friction force between the O-rings 242 and the wafer W, the holding parts 241 hold the rear surface of the peripheral edge portion of the wafer W. The transfer arm 101 can thus horizontally hold the wafer W on the holding parts 241. Further, since the radius of curvature of the arm part 240 is larger than the radius of the wafer W, the peripheral edge portion of the wafer W never comes into contact with the arm part 240. Further, the holding parts 241 hold the rear surface of the peripheral edge portion of the wafer W, so that even if particles are generated between the holding parts 241 and the wafer W, the particles hardly get around to the front surface side of the wafer W as compared to the case that the side surface of the wafer is held as in the prior art. Therefore, the front surface of the wafer W can be kept clean. Note that the holding part 241 constitutes another holding part.

At the base end portion of the arm part 240, a support part 243 is provided which is integrally formed with the arm part 240 and supports the arm part 240 as illustrated in FIG. 10. The support part 243 is provided with an arm drive unit (not illustrated). By means of the arm drive unit, the transfer arm 101 is movable in the horizontal direction, in the vertical direction, and around the vertical axis (in the θ-direction).

Note that the configuration of the transfer arm 103 is the same as the configuration of the above-described transfer arm 101, and therefore the description thereof is omitted.

In the above coating and developing treatment system 1, the control unit 300 is provided as illustrated in FIG. 1. The control unit 300 is, for example, a computer and has a program storage unit (not illustrated). In the program storage unit, a program executing wafer processing in the coating and developing treatment system 1 is stored. Note that the program may be the one recorded, for example, in a computer-readable storage medium H such as a computer-readable hard disk (HD), flexible disk (FD), compact disk (CD), magneto-optical disk (MO), or memory card and installed from the storage medium H into the control unit 300.

Next, a treatment method of the wafer W performed using the coating and developing treatment system 1 configured as described above will be described.

First, a cassette C housing a plurality of wafers W is mounted on a predetermined cassette mounting plate 11 in the cassette station 2. The wafers W in the cassette C are sequentially taken out by the wafer transfer apparatus 21 and transferred, for example, to the delivery apparatus 54 in the third treatment block G3 in the treatment station 3.

The wafer W is then transferred by the wafer transfer apparatus 100 to the temperature regulation apparatus 53 and regulated to a predetermined temperature, for example, room temperature. The wafer W is then transferred by the wafer transfer apparatus 80 to the adhesion apparatus 41 in the second treatment block G2 and subjected to adhesion treatment.

The wafer W is then transferred by the wafer transfer apparatus 80 to the temperature regulation apparatus 55 in the third treatment block G3 and regulated to a predetermined temperature, for example, room temperature.

The wafer W is then transferred by the wafer transfer apparatus 80 to the position adjustment apparatus 42 in the second treatment block G2. In the position adjustment apparatus 42, the center position of the wafer W is adjusted. Here, the position adjustment performed in the position adjustment apparatus 42 when the center position of the wafer W transferred by the wafer transfer apparatus 80 from the temperature regulation apparatus 55 is displaced from the predetermined position will be described based on FIG. 11A to FIG. 11E.

Figure 11A:
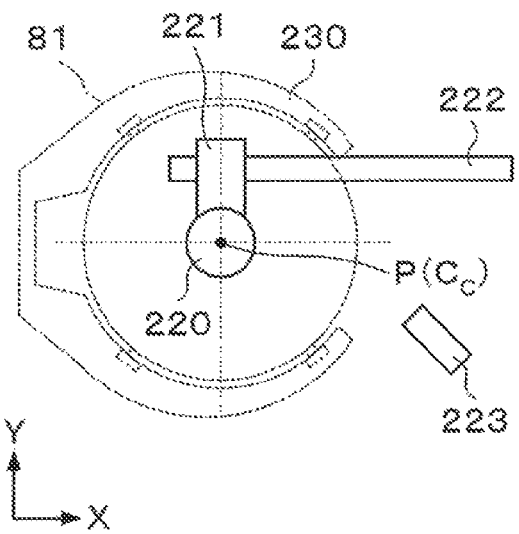
FIG. 11A is an explanatory view illustrating the appearance that a chuck is waiting at a predetermined position when the center position of the wafer is adjusted in the position adjustment apparatus.

In the position adjustment apparatus 42, the center position of the wafer W is adjusted such that the wafer W is held at an appropriate position on the arm part 230 of the transfer arm 81 as illustrated in FIG. 11A, namely, the center position of the arm part 230 is aligned with the center position of the wafer W. The center position of the wafer W after such positional adjustment is regarded as a home position P in the position adjustment apparatus 42. Further, the chuck 220 is waiting so that a central portion $C_C$ of the chuck 220 is located at the home position P.

Figure 11B:
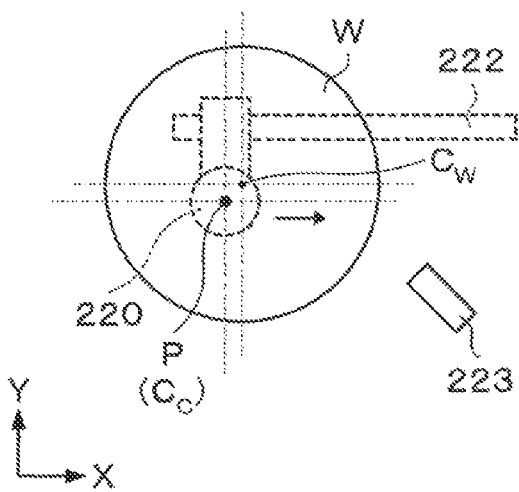
FIG. 11B is an explanatory view illustrating the appearance that the wafer is delivered from the transfer arm to the chuck when the center position of the wafer is adjusted in the position adjustment apparatus.

With the chuck 220 waiting in this manner, the wafer W is delivered from the transfer arm 81 to the chuck 220 as illustrated in FIG. 11B. In this event, a central portion $C_W$ of the wafer W is displaced from the home position P (the center position $C_C$ of the chuck 220).

Figure 11C:
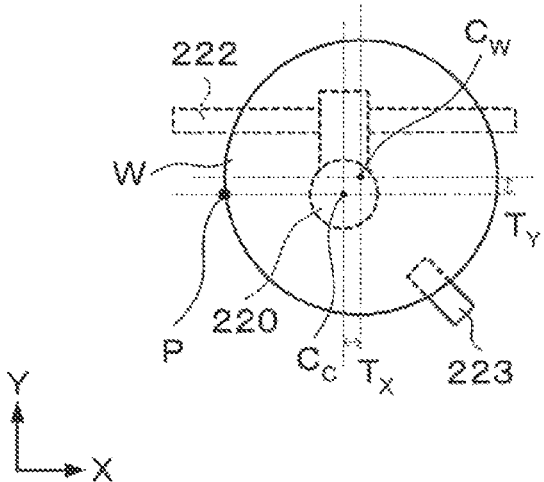
FIG. 11C is an explanatory view illustrating the appearance that the center position of the wafer is detected by a position detection unit when the center position of the wafer is adjusted in the position adjustment apparatus.

The wafer W is then moved by the chuck drive unit 221 along the rail 222 and the wafer W is disposed at a position where an image of the peripheral edge portion of the wafer W can be captured by the position detection unit 223 as illustrated in FIG. 11C. Thereafter, the center position of the wafer W, namely, displacement amounts $T_X$, $T_Y$ of the central portion $C_W$ of the wafer W are detected by the position detection unit 223 while the wafer W is being rotated by the chuck drive unit 221. Note that $T_X$, $T_Y$ are displacement amounts from the center position $C_C$ of the chuck 220, $T_X$ being a displacement amount in the X-direction and $T_Y$ being a displacement amount in the Y-direction.

Figure 11D:
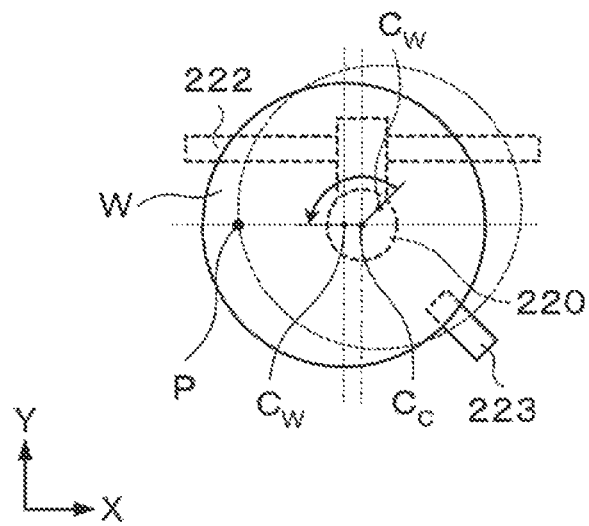
FIG. 11D is an explanatory view illustrating the appearance that the wafer is turned around the vertical axis when the center position of the wafer is adjusted in the position adjustment apparatus.

Thereafter, the center position of the wafer W is adjusted by the control unit 300 based on the detection result of the position detection unit 223. Concretely, the wafer W is turned around the vertical axis so that $T_Y$ becomes zero as illustrated in FIG. 11D.

Figure 11E:
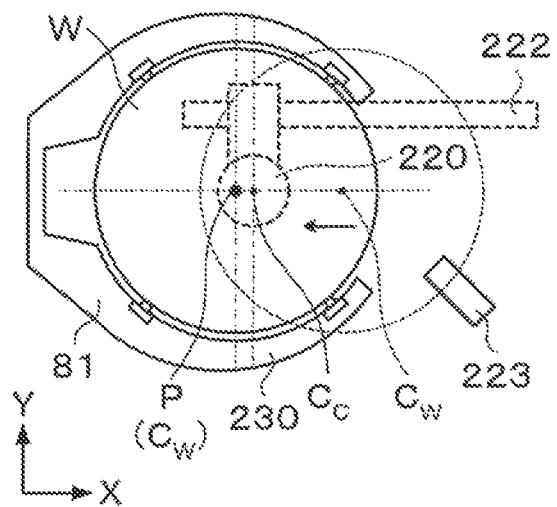
FIG. 11E is an explanatory view illustrating the appearance that the wafer is moved in an X-direction when the center position of the wafer is adjusted in the position adjustment apparatus.

Then, the wafer W is moved by the chuck drive unit 221 in the X-direction so that the central portion $C_W$ of the wafer W is located at the home position P as illustrated in FIG. 11E. Thus, the adjustment of the center position of the wafer W is completed. The wafer W is then delivered from the chuck 220 to the transfer arm 81. In this event, the wafer W is held by the transfer arm 81 such that the center position of the arm part 230 of the transfer arm 81 is aligned with the center position of the wafer W. In short, the peripheral edge portion of the wafer W is not in contact with the arm part 230.

Figure 12:
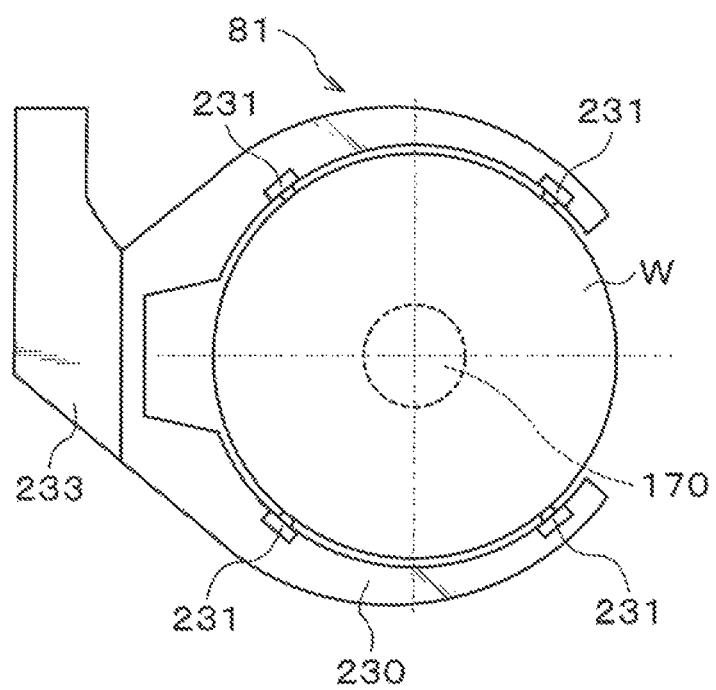
FIG. 12 is an explanatory view illustrating the appearance that the wafer is delivered from the transfer arm to the spin chuck in the coating treatment apparatus.

The wafer W delivered to the transfer arm 81 of the wafer transfer apparatus 80 in this manner is then transferred to the coating treatment apparatus 33 and delivered from the transfer arm 81, for example, to the spin chuck 170 in the coating unit 140. In this event, in the coating treatment apparatus 33, the wafer W is delivered from the transfer arm 81 to the spin chuck 170 such that the center position of the wafer W held by the arm part 230 is aligned with the center position of the spin chuck 170 illustrated in FIG. 12.

Thereafter, the first polyimide nozzle 153 is moved to a position above the center portion of the wafer W. Subsequently, the wafer W held on the spin chuck 170 is rotated by the rotation drive unit 172 and the polyimide solution is supplied from the first polyimide nozzle 153 to the central portion of the wafer W. The polyimide solution supplied on the wafer W is spread over the front surface of the wafer W by the centrifugal force generated by the rotation of the wafer W and thereby applied on the front surface of the wafer W. Then, after the supply of the polyimide solution from the first polyimide nozzle 153 is stopped, the wafer W is continuously rotated. The film thickness of the polyimide solution on the wafer W is adjusted, and the polyimide solution is dried, whereby a polyimide film is formed on the wafer W. Note that after the polyimide film is formed on the wafer W, the rinse solution may be jetted from the back rinse nozzles 175 to the rear surface of the wafer W to clean the rear surface of the wafer W.

Note that when the polyimide solution is applied from the first polyimide nozzle 153 onto the wafer W, the polyimide solution scattered from the wafer W is recovered in the cup 180 or the cup base 173. Further, when the rinse solution is applied from the back rinse nozzles 175 to the rear surface of the wafer W, the generated waste liquid is recovered in the cup base 173 or the cup 180. The waste liquid recovered in the cup 180 and the cup base 173 is drained to the recovery tank 201 via the waste liquid container 190, the vertical pipe 202, and the inclined pipe 203. Since the vertical pipe 202 and the inclined pipe 203 have predetermined inclinations, the waste liquid smoothly flows through the vertical pipe 202 and the inclined pipe 203 without clogging in this event.

The wafer W is then transferred out of the coating treatment apparatus 33 by the wafer transfer apparatus 80. In this event, the wafer W is delivered from the spin chuck 170 to the transfer arm 81 such that the center position of the wafer W held on the spin chuck 170 is aligned with the center position of the wafer W to be held by the arm part 230 as in the case illustrated in FIG. 12. Accordingly, the wafer W is held by the transfer arm 81 with the peripheral edge portion of the wafer W not in contact with the arm part 230.

The wafer W is then transferred by the wafer transfer apparatus 80 to the thermal treatment apparatus 40 and subjected to prebaking. The wafer W is then transferred by the wafer transfer apparatus 80 to the temperature regulation apparatus 75 in the fourth treatment block G4 and regulated to a predetermined temperature, for example, room temperature.

The wafer W is then transferred by the wafer transfer apparatus 80 to the position adjustment apparatus 42 in the second treatment block G2. In the position adjustment apparatus 42, the center position of the wafer W is adjusted. The adjustment of the center position of the wafer W is the same as the adjustment of the center position of the wafer W described in FIG. 11A to FIG. 11E, and therefore the detailed description will be omitted.

The wafer W is then transferred by the wafer transfer apparatus 80 to the peripheral edge portion cleaning apparatus 34. In this event, in the peripheral edge portion cleaning apparatus 34, the wafer W is delivered from the transfer arm 81 to the spin chuck 170 such that the center position of the wafer W held by the arm part 230 of the transfer arm 81 is aligned with the center position of the wafer W to be held on the spin chuck 170.

Thereafter, the edge rinse nozzle is moved to a position above the peripheral edge portion of the wafer W. Subsequently, the wafer W held on the spin chuck 170 is rotated by the rotation drive unit 172 and the rinse solution is supplied from the edge rinse nozzle to the peripheral edge portion of the wafer W. The rinse solution removes the polyimide film on the peripheral edge portion of the wafer W and thereby clean the peripheral edge portion of the wafer W.

The wafer W is then transferred by the wafer transfer apparatus 80 to the edge exposure apparatus 43 and subjected to edge exposure processing. The wafer W is then transferred by the wafer transfer apparatus 80 to the delivery apparatus 56 in the third treatment block G3.

The wafer W is then transferred by the wafer transfer apparatus 100 to the delivery apparatus 52 and transferred by the shuttle apparatus 90 to the delivery apparatus 72 in the fourth treatment block G4.

The wafer W is then transferred by the wafer transfer apparatus 110 in the interface station 5 to the aligner 4 and subjected to exposure processing.

Then, the wafer W is transferred by the wafer transfer apparatus 110 from the aligner 4 to the delivery apparatus 70 in the fourth treatment block G4. The wafer W is then transferred by the wafer transfer apparatus 80 to the thermal treatment apparatus 40 in the second treatment block G2 and subjected to post-exposure baking. The wafer W is then transferred by the wafer transfer apparatus 80 to the developing treatment apparatus 30 in the first treatment block G1 and developed. After completion of the development, the wafer W is transferred by the wafer transfer apparatus 80 to the thermal treatment apparatus 40 in the second treatment block G2 and subjected to post-baking.

The wafer W is then transferred by the wafer transfer apparatus 80 to the delivery apparatus 50 in the third treatment block G3, and then transferred by the wafer transfer apparatus 21 in the cassette station 2 to the cassette C on the predetermined cassette mounting plate 11. Thus, a predetermined pattern is formed in the polyimide film on the wafer W, with which a series of photolithography processing ends.

According to the above embodiment, after the temperature regulation of the wafer W in the temperature regulation apparatus 55, the center position of the wafer W held on the chuck 220 is adjusted to align with the center position of the wafer W to be held by the arm part 230 of the transfer arm 81 in the position adjustment apparatus 42. Thus, when the wafer W is transferred out of the position adjustment apparatus 42 by the wafer transfer apparatus 80, the wafer W can be delivered from the chuck 220 to an appropriate position of the arm part 230. In other words, the wafer W is delivered to transfer arm 81 such that the center position of the arm part 230 is aligned with the center position of the wafer W. Thereafter, also when the wafer W is transferred to the coating treatment apparatus 33 by the wafer transfer apparatus 80, the wafer W can be appropriately delivered from the arm part 230 to the spin chuck 170 such that the center position of the wafer W held by the arm part 230 is aligned with the center position of the wafer W to be held on the spin chuck 170. Accordingly, it is possible to appropriately apply the polyimide solution onto the wafer W held on the spin chuck 170 to form a polyimide film.

Further, also after the temperature regulation of the wafer W in the temperature regulation apparatus 75, the center position of the wafer W is adjusted in the position adjustment apparatus 42. This ensures that when the wafer W is transferred out of the position adjustment apparatus 42 by the wafer transfer apparatus 80, the wafer W can be delivered from the chuck 220 to an appropriate position on the arm part 230 of the transfer arm 81. Further, also when the wafer W is thereafter transferred to the peripheral edge portion cleaning apparatus 34 by the wafer transfer apparatus 80, the wafer W can be delivered from the arm part 230 to an appropriate position on the spin chuck 170. Accordingly, it is possible to supply the rinse solution to an appropriate position on the peripheral edge portion of the wafer W held on the spin chuck 170 to appropriately clean the peripheral edge portion.

Furthermore, since the center position of the wafer W is adjusted in the position adjustment apparatus 42, the wafer W is held by the transfer arm 81 such that the center position of the arm part 230 is aligned with the center position of the wafer W during the transfer of the wafer W by the wafer transfer apparatus 80. In this event, since a friction force is generated between the holding parts 231 of the transfer arm 81 and the wafer W, the wafer W is held by the transfer arm 81 without displacement from the holding parts 231. Therefore, the peripheral edge portion of the wafer W never comes into contact with the arm part 230. In other words, during the transfer of the wafer W from the coating treatment apparatus 33 to the thermal treatment apparatus 40, the transfer of the wafer W from the thermal treatment apparatus 40 to the temperature regulation apparatus 75, the transfer of the wafer W from the temperature regulation apparatus 75 to the position adjustment apparatus 42, and the transfer of the wafer W from the position adjustment apparatus 42 to the peripheral edge portion cleaning apparatus 34, the peripheral edge portion of the wafer W never comes into contact with the arm part 230. Accordingly, the polyimide film on the wafer W never adheres to the arm part 230, thus never causing particle contamination unlike the prior art. In particular, when a high viscosity coating solution (for example, a polyimide solution in this embodiment) is applied onto the wafer, the coating film easily adheres to the transfer arm. Therefore, this embodiment is particularly useful in the case of using the high viscosity coating solution.

Figure 13:
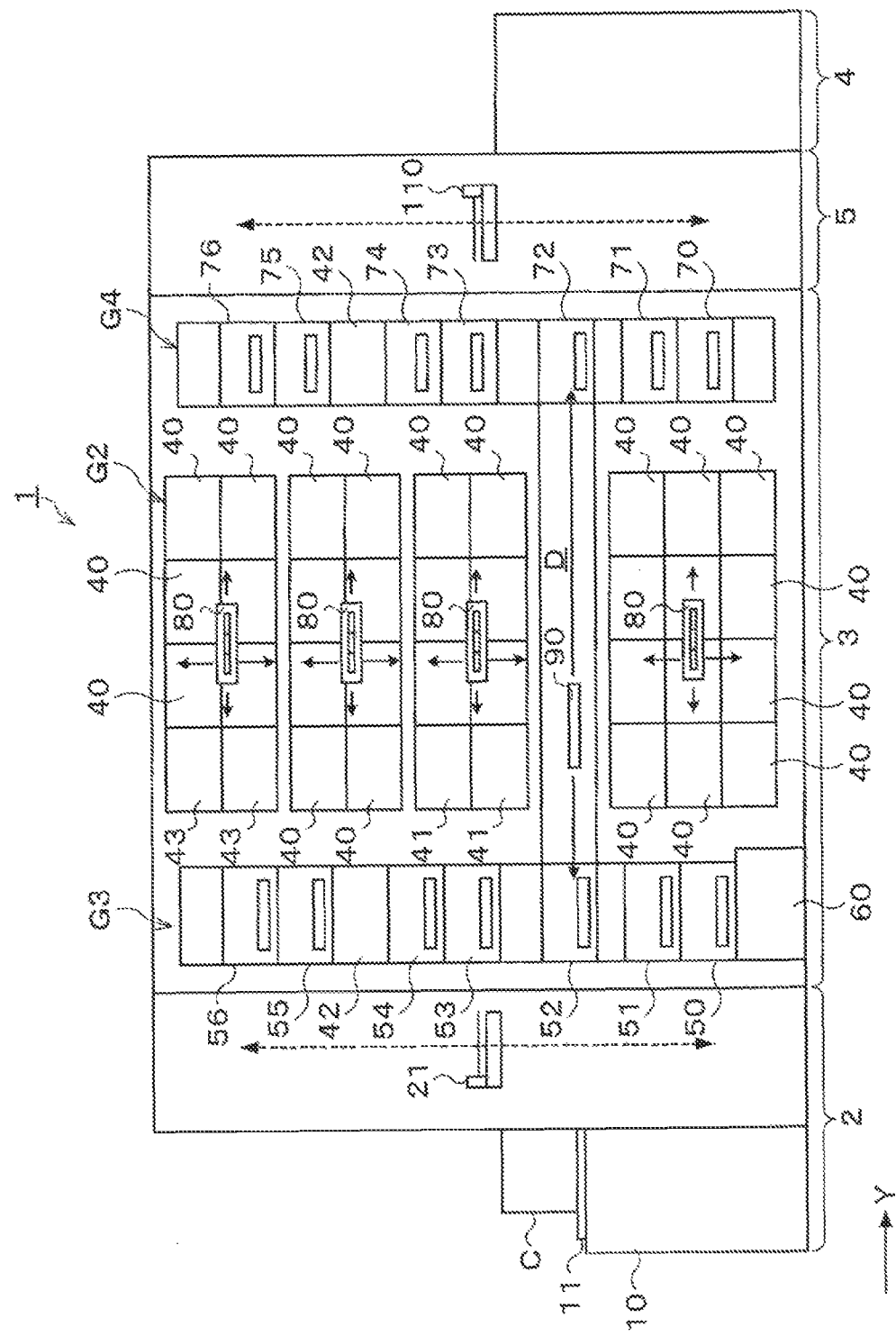
FIG. 13 is a side view illustrating the outline of the internal configuration of a coating and developing treatment system according to another embodiment.

The position adjustment apparatuses 42 in the coating and developing treatment system 1 of the above embodiment are disposed in the second treatment block G2, but may be disposed in the third treatment block G3 and the fourth treatment block G4 as other treatment blocks as illustrated in FIG. 13. In this case, for the transfer of the wafers W from the above-described temperature regulation apparatuses 55, 75 to the position adjustment apparatuses 42, the wafer transfer apparatuses 100, 102 are used in place of the wafer transfer apparatuses 80. This makes it possible to omit a part of the transfer of the wafer W by the wafer transfer apparatus 80 that is high in operation rate. Further, the thermal treatment apparatuses 40 requiring a long treatment time can be additionally disposed at the positions where the position adjustment apparatuses 42 have been disposed in the second treatment block G2. Accordingly, the throughput of the whole wafer processing can be improved.

Note that since the radius of curvature of the arm part 240 in the transfer arm 101, 103 of the wafer transfer apparatus 100, 102 is larger than the radius of the wafer W, the peripheral edge portion of the wafer W never comes into contact with the arm part 240. Accordingly, the polyimide film on the wafer W never adheres to the arm part 240, thus never causing particle contamination unlike the prior art.

The wafer W held on the chuck 220 is turned around the vertical axis and moved in the X-direction in the position adjustment apparatus 42 in the above embodiment, but the wafer W may be moved in two horizontal directions, the X-direction and the Y-direction. In other words, the wafer W may be moved in the X-direction and the Y-direction based on the displacement amounts $T_X$, $T_Y$ of the central portion $C_W$ of the wafer W detected by the position detection unit 223. In this case, the wafer W held on the chuck 220 may be moved in the Y-direction, for example, by expansion and contraction in the Y-direction of the chuck drive unit 221.

Further, coating solution nozzles similar to the polyimide nozzles 153, 160 of the coating treatment apparatus 33 may be provided in the peripheral edge portion cleaning apparatus 34 in the above embodiment. In this case, for example, resist nozzles supplying a resist solution as the coating solution are provided as the coating solution nozzles of the peripheral edge portion cleaning apparatus 34. Further, the resist solution is supplied from the resist nozzle onto the wafer W, whereby a resist film is formed on the wafer W.

Further, an edge rinse nozzle supplying the rinse solution to the peripheral edge portion of the wafer W may be provided also in the coating treatment apparatus 33 of the above embodiment as in the peripheral edge portion cleaning apparatus 34.

Though the case of using the polyimide solution as the coating solution has been described in the above embodiment, the present invention is preferably applicable not only to the polyimide solution but also to another coating solution, such as a high viscosity coating solution such as a color resist used in manufacture of an image sensor or the like.

Figure 14:
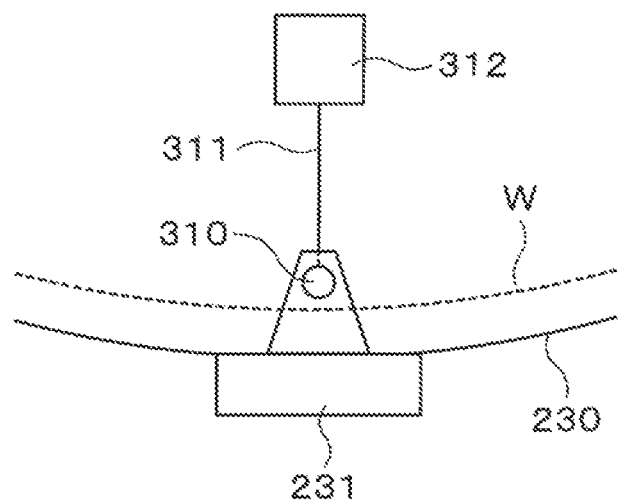
FIG. 14 is a plan view illustrating the outline of the configuration of a holding part of a transfer arm according to another embodiment.

The holding parts 231, 241 each holding the wafer W have the respective O-rings 232, 242 in the transfer arms 81, 101 in the above embodiment, but the present invention is not limited to them. The holding parts 231, 241 only need to generate the friction force between the holding parts 231, 241 and the rear surface of the peripheral edge portion of the wafer W, and may have other suction pads or the like in place of the O-rings 232, 242. Alternatively, a suction port 310 may be formed at the tip portion of the holding part 231 as illustrated in FIG. 14 so that the holding part 231 holds the wafer W by suction from the suction port 310. In this case, the suction port 310 is connected to a vacuum pump 312 via a vacuum pipe 311. Note that a suction port 310 connected to the vacuum pump 312 may be similarly formed at the holding part 241.

Furthermore, the present invention is particularly useful in the case of using the high viscosity coating solution as described above, and the present invention is also preferably applicable to a relatively low viscosity coating solution, for example, a standard resist, an SOD (Spin On Dielectric) film treatment solution, and an SOG (Spin On Glass) film treatment solution. Also in this case, it is possible to prevent the coating film from adhering to the transfer arm to prevent particle contamination.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the examples but take various forms. The present invention is also applicable to the case that the substrate is other substrates such as an FPD (Flat Panel Display), a mask reticle for a photomask, and the like other than the wafer.

What is claimed is:

1. A substrate treatment system comprising
a plurality of treatment apparatuses treating a substrate,
a position adjustment apparatus adjusting a center position of the substrate,
a substrate transfer apparatus transferring the substrate to said treatment apparatuses and said position adjustment apparatus, and
a control unit controlling operations of said apparatuses, said substrate transfer apparatus comprising
an arm part curved along a peripheral edge portion of the substrate with a radius of curvature larger than a radius of the substrate, and
a holding part projecting inward from said arm part and holding a rear surface of the substrate, without contacting a side surface of the substrate,
said position adjustment apparatus comprising
a mounting table which holds a central portion of the rear surface of the substrate and is rotatable and horizontally movable,
wherein said control unit is configured to control said mounting table to rotate and horizontally move such that the center position of the substrate held on said mounting table is aligned with a center position of said arm part.

2. The substrate treatment system as set forth in claim 1, wherein said position adjustment apparatus comprises a position detection unit detecting the center position of the substrate held on said mounting table and a moving mechanism moving said mounting table, and
wherein said moving mechanism turns said mounting table around a vertical axis and moves said mounting table in one direction being a horizontal direction based on a detection result of the center position of the substrate by said position detection unit.

3. The substrate treatment system as set forth in claim 1, wherein said holding part holds the substrate by a friction force between said holding part and the substrate.

4. The substrate treatment system as set forth in claim 1, wherein said holding part has a suction port formed at a tip portion thereof and connected to a vacuum pump, and
wherein said holding part holds the substrate by suction from said suction port.

5. The substrate treatment system as set forth in claim 1, wherein said plurality of treatment apparatuses include a coating treatment apparatus applying a coating solution onto the substrate whose center position has been adjusted in said position adjustment apparatus.

6. The substrate treatment system as set forth in claim 5, wherein the coating solution is a polyimide solution.

7. The substrate treatment system as set forth in claim 5, further comprising:
a treatment block in which said treatment apparatuses including said coating treatment apparatus are stacked in multiple tiers in a vertical direction;
another treatment block in which said position adjustment apparatus and another treatment apparatus are stacked in multiple tiers in the vertical direction; and
another substrate transfer apparatus transferring the substrate to said position adjustment apparatus and said another treatment apparatus in said another treatment block,
wherein said another substrate transfer apparatus comprises another arm part curved along the peripheral edge portion of the substrate with a radius of curvature larger than the radius of the substrate, and another holding part projecting inward from said another arm part and holding the rear surface of the substrate.

8. The substrate treatment system as set forth in claim 7, wherein said another holding part holds the substrate by a friction force between said another holding part and the substrate.

9. The substrate treatment system as set forth in claim 7, wherein said another holding part has a suction port formed at a tip portion thereof and connected to a vacuum pump, and
wherein said another holding part holds the substrate by suction from said suction port.

10. The substrate treatment system as set forth in claim 5, wherein said plurality of treatment apparatuses include:
a temperature regulation apparatus regulating a temperature of the substrate,
a thermal treatment apparatus performing thermal treatment on the substrate on which the coating solution has been applied in said coating treatment apparatus, to form a coating film on the substrate, and
a peripheral edge portion cleaning apparatus cleaning and removing the coating film on the peripheral edge portion of the substrate formed in said thermal treatment apparatus,
wherein said substrate transfer apparatus transfers the substrate to said temperature regulation apparatus, said thermal treatment apparatus, and said peripheral edge portion cleaning apparatus.

11. A substrate treatment method using a substrate treatment system, the substrate treatment system comprising a plurality of treatment apparatuses treating a substrate, a position adjustment apparatus adjusting a center position of the substrate, and a substrate transfer apparatus transferring the substrate to the treatment apparatuses and the position adjustment apparatus,
the substrate transfer apparatus comprising an arm part curved along a peripheral edge portion of the substrate with a radius of curvature larger than a radius of the substrate, and a holding part projecting inward from the arm part and holding a rear surface of the substrate,
the position adjustment apparatus comprising a mounting table which holds a central portion of the rear surface of the substrate and is rotatable and horizontally movable,
said substrate treatment method comprising:
a position adjustment step of rotating and horizontally moving the mounting table such that the center position of the substrate held on the mounting table is aligned with a center position of the arm part in the position adjustment apparatus; and
a transfer step of then transferring the substrate out of the position adjustment apparatus using the substrate transfer apparatus with the peripheral edge portion of the substrate not in contact with the arm part.

12. The substrate treatment method as set forth in claim 11, wherein the position adjustment apparatus comprises a position detection unit detecting the center position of the substrate held on the mounting table and a moving mechanism moving the mounting table, and
wherein said position adjustment step comprises the steps of:
detecting the center position of the substrate by the position detection unit; and
turning the mounting table around a vertical axis and moving the mounting table in one direction being a horizontal direction by the moving mechanism based on a result of the position detection.

13. The substrate treatment method as set forth in claim 11, wherein the plurality of treatment apparatuses include a coating treatment apparatus comprising another mounting table holding and rotating the central portion of the rear surface of the substrate and a coating solution nozzle supplying the coating solution onto the substrate held on the another mounting table, and wherein after said transfer step, the substrate is delivered between the arm part and the another mounting table such that the center position of the substrate held by the arm part is aligned with a center position of the another mounting table.

14. The substrate treatment method as set forth in claim 13, wherein the coating solution is a polyimide solution.

15. The substrate treatment method as set forth in claim 11, wherein the holding part holds the substrate by a friction force between the holding part and the substrate.

16. The substrate treatment method as set forth in claim 11, wherein the holding part has a suction port formed at a tip portion thereof and connected to a vacuum pump, and wherein the holding part holds the substrate by suction from the suction port.

17. The substrate treatment method as set forth in claim 13, wherein the plurality of treatment apparatuses include:

a temperature regulation apparatus regulating a temperature of the substrate, a thermal treatment apparatus performing thermal treatment on the substrate on which the coating solution has been applied in the coating treatment apparatus, to form a coating film on the substrate, and a peripheral edge portion cleaning apparatus cleaning and removing the coating film on the peripheral edge portion of the substrate formed in the thermal treatment apparatus, wherein said substrate treatment method comprises:

a first temperature regulation step of regulating a temperature of the substrate to a predetermined temperature in the temperature regulation apparatus, before said position adjustment step;

a thermal treatment step of performing thermal treatment on the substrate after applying the coating solution onto the substrate in the coating treatment apparatus, to form the coating film on the substrate in the thermal treatment apparatus;

a second temperature regulation step of regulating the temperature of the substrate to a predetermined temperature in the temperature regulation apparatus, after said thermal treatment step;

another position adjustment step of adjusting the center position of the substrate in the position adjustment apparatus, after said second temperature regulation step; and a peripheral edge portion cleaning step of cleaning and removing the coating film on the peripheral edge portion of the substrate in the peripheral edge portion cleaning apparatus, after said another position adjustment step, wherein transfer of the substrate to the temperature regulation apparatus, the thermal treatment apparatuses, and the peripheral edge portion cleaning apparatus is performed using the substrate transfer apparatus with the peripheral edge portion of the substrate not in contact with the arm part.

18. The substrate treatment system as set forth in claim 1, wherein said plurality of treatment apparatuses include a waste liquid recovery apparatus disposed below said coating treatment apparatus, and recovering a waste liquid drained from said coating treatment apparatus, and wherein said waste liquid recovery apparatus comprises a recovery tank recovering the waste liquid from said coating treatment apparatus, a vertical pipe provided to extend vertically downward from said coating treatment apparatus, and an inclined pipe provided to extend from an end portion of said vertical pipe to said recovery tank inclined at a predetermined angle.

* * * * *